United States Patent
Da Dalt

(10) Patent No.: US 8,963,588 B2
(45) Date of Patent: Feb. 24, 2015

(54) FRACTIONAL FREQUENCY DIVIDER

(75) Inventor: Nicola Da Dalt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/215,135

(22) Filed: Aug. 22, 2011

(65) Prior Publication Data

US 2013/0049821 A1    Feb. 28, 2013

(51) Int. Cl.
*H03B 19/00*    (2006.01)
*H03L 7/197*    (2006.01)

(52) U.S. Cl.
CPC .................................. *H03L 7/1976* (2013.01)
USPC ............ 327/117; 327/115; 327/149; 327/158

(58) Field of Classification Search
USPC ......... 327/115, 116, 117, 118, 355–361, 202, 327/203, 208–212, 218; 377/47, 48
See application file for complete search history.

(56) References Cited

U.S. PATENT DOCUMENTS

| | | | |
|---|---|---|---|
| 6,157,694 A * | 12/2000 | Larsson | 377/48 |
| 6,710,633 B2 | 3/2004 | Da Dalt | |
| 7,298,218 B2 * | 11/2007 | Ghazali et al. | 331/16 |
| 7,965,808 B2 * | 6/2011 | Marutani | 377/47 |
| 2006/0030285 A1 * | 2/2006 | Ghazali et al. | 455/260 |
| 2008/0164917 A1 * | 7/2008 | Floyd et al. | 327/117 |
| 2010/0225361 A1 * | 9/2010 | Rhee et al. | 327/105 |

\* cited by examiner

*Primary Examiner* — Brandon S Cole

(74) *Attorney, Agent, or Firm* — SpryIP, LLC

(57) ABSTRACT

An oscillator may output phased signals to a phase interpolator which is to generate an adjustable output clock signal having a phase offset relative to at least one of the phased signals received from the oscillator. A divider may then divide the frequency of the output signal generated by the phase interpolator by an integer factor.

17 Claims, 5 Drawing Sheets

FRACTIONAL FREQUENCY DIVIDER

BACKGROUND

In the field of frequency generation, frequency dividers may be used to divide the frequency of the clock of a controlled oscillator (CO). The divided clock output of the divider may then be input to a phase detector for comparison with a reference clock. The output of the phase detector may be used to control the CO until the divided clock and the reference clock are frequency locked. In this configuration, the output CO frequency ($F_o$) may be equal to the reference clock frequency ($F_r$) multiplied by the divider factor N: $F_o = N*F_r$. For standard frequency dividers, N may be bounded to be an integer value, so that $F_o$ is an integer multiple of $F_r$.

For applications including generation of carrier frequency for channels in wireless applications, generation of spread-spectrum clocks in wireline applications, and generation of multiple frequencies from a common CO in general clock generation units, it may be desirable for $F_o$ to be a fractional multiple of $F_r$, so that N may be a fractional number.

SUMMARY

In one example, an oscillator may output phased signals to a phase interpolator which is to generate an adjustable output clock signal having a phase offset relative to at least one of the phased signals received from the oscillator. A divider may then divide the frequency of the output signal generated by the phase interpolator by an integer factor.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict plural embodiments in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which are also part of the description. Unless otherwise noted, the description of successive drawings may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, may be arranged, substituted, combined, separated, and designed in a wide variety of different configurations, all of which are explicitly contemplated herein.

Figure 1:
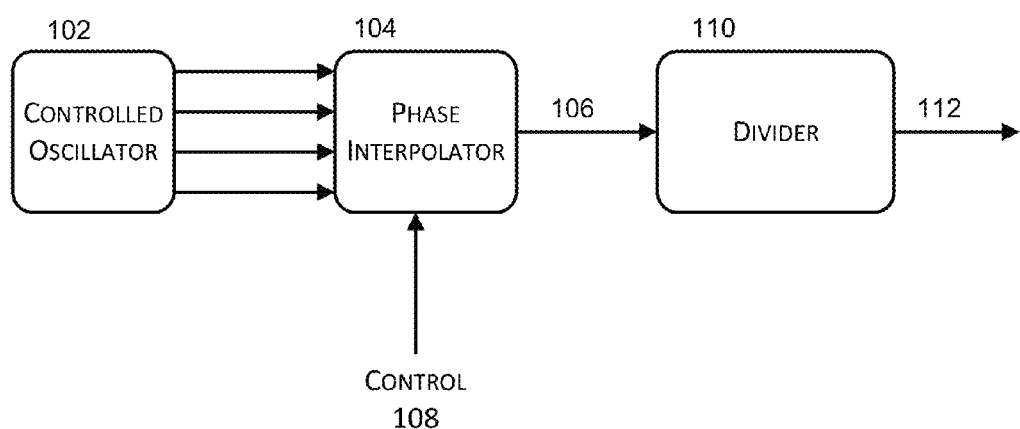
FIG. 1 is a block diagram showing representations of components for implementing fractional frequency division in accordance with at least one example embodiment system.

FIG. 1 is a block diagram showing representations of components for implementing fractional frequency division in accordance with at least one example embodiment system 100.

Controlled oscillator (CO) 102 may generate and output at least two phased signals.

Phase interpolator 104 may receive the phased signals from CO 102, and therefrom may further generate an adjustable output clock signal 106. Relative to at least one of the phased signals from CO 102, adjustable output clock signal 106 may have the same frequency as well as a phase offset that may be fine-adjusted in the range of 0 to 360° (degrees).

Control 108 may be a signal input to phase interpolator 104 to digitally control generation of the adjustable output clock signal 106. More particularly, control 108 may control the phase position of output clock signal 106. To that effect, the number of available phase positions may be set at $2^{N_b}$, with $N_b$ being the number of control bits in phase interpolator 104.

Further, control 108 may be controlled such that the phase adjustable output clock signal 106 may advance or lag by a certain fractional amount of the period "T" of CO 102 every clock cycle of divided output clock 112.

Integer-N Divider 110 may receive adjustable output clock signal 106 to execute integer division thereat and produce the divided output clock 112. Integer N divider may divide adjustable output clock signal 106 by an integer factor; therefore, further couple thereto the phase of adjustable output clock signal 106 being finely shifted in phase interpolator 105, and a fine fractional divider factor is thereby implemented.

Figure 2:
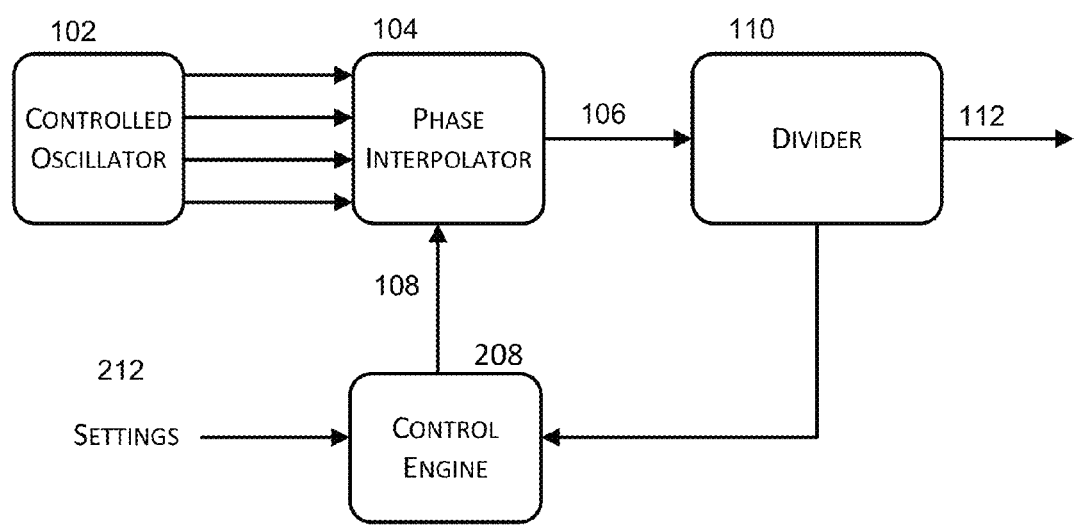
FIG. 2 is a block diagram showing representations of components for implementing fractional frequency division in accordance with at least one other example embodiment system.

FIG. 2 is a block diagram showing representations of components for implementing fractional frequency division in accordance with at least one other example embodiment system 200.

The example embodiment system 200 described in connection with FIG. 2 is a modification of the example embodiment system 100 described in connection with FIG. 1; hence, the inclusion of CO 102, phase interpolator 104, and divider 110. However, rather than have control 108 input to phase interpolator 104 via a bus, control engine 208 is further included in system 200. The description of the components thus follows.

Controlled oscillator (CO) 102 may generate and output at least two phased signals.

Phase interpolator 104 may receive the phased signals from CO 102, and may further generate an adjustable output clock signal 106. Relative to at least one of the phased signals from CO 102, adjustable output clock signal 106 may have the same frequency as well as a phase offset that may be fine-adjusted in the range of 0 to 360° (degrees).

Control engine 208 may receive external settings 212 so as to dynamically change control 108. As an example of such external settings, by the example embodiment of FIG. 2, control engine 208 may be clocked by the divided output clock from divider 110; alternatively, control engine 208 may be clocked by other clocks available in the system 200, thereby also enabling dynamic change of control 108. In at least one embodiment of system 200, control engine 208 may be implemented as a delta sigma modulator.

Regardless, control 108 may control the phase position of adjustable output clock signal 106. To that effect, the number of available phase positions may be set at $2^{\wedge}N_b$, with $N_b$ being the number of control bits in phase interpolator 104. Further, control 108 may be controlled such that the phase adjustable output clock signal 106 may advance or lag by a certain fractional amount of the period "T" of CO 102 every clock cycle of divided output clock 112.

Integer-N Divider 110 may receive output clock signal 106 to execute integer division thereat. Integer N divider 110 may divide adjustable output clock signal 106 by an integer factor but, since the phase of adjustable output clock signal 106 has been finely shifted in phase interpolator 105, fine fractional divider factor may be implemented.

Figure 2A:
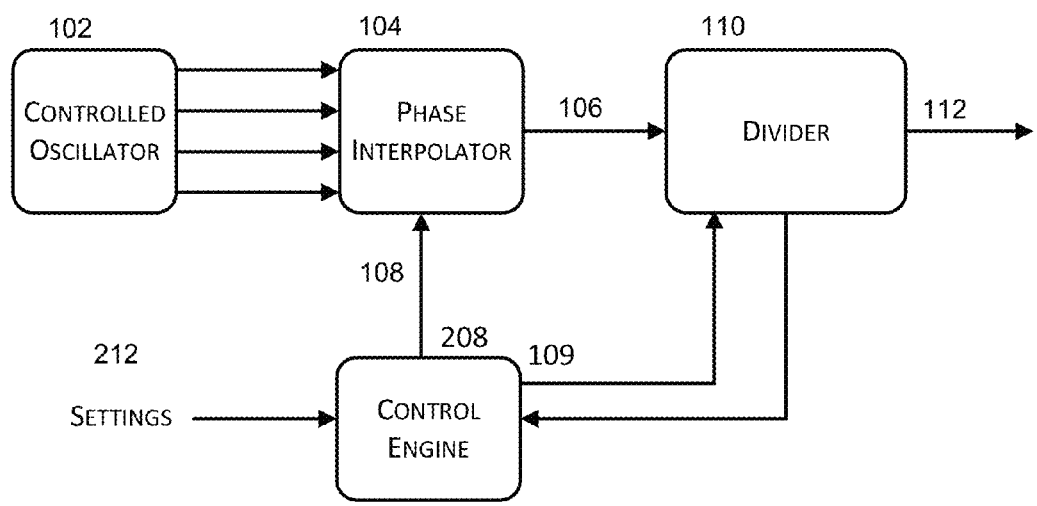
FIG. 2A is a block diagram showing representations of components for implementing fractional frequency division in accordance with at least one other example embodiment system.

FIG. 2A is a block diagram showing representations of components for implementing fractional frequency division in accordance with at least one other example embodiment system 200A. The example embodiment system 200A described in connection with FIG. 2A is a modification of the example embodiment systems 100 and 200 described in connection with FIGS. 1 and 2, respectively; hence, the inclusion of CO 102, phase interpolator 104, divider 110, and control engine 208.

In addition to the foregoing, FIG. 2A illustrates the use of control 109. Control engine 208 may receive external settings 212 so as to dynamically change control 109. As an example of such external settings, by the example embodiment of FIG. 2A, control engine 208 may be clocked by the divided output clock from divider 110; alternatively, control engine 208 may be clocked by other clocks available in the system 200, thereby also enabling dynamic change of control 109. In one implementation, control 109 is capable of programming the Integer-N Divider 110 to thereby vary the fractional division range of the divider 110. For example, the control 109 may be used to modify the divider factor associated with the divider 110. In one implementation, control 109 may be used to modify the divider factor of the divider 110 to achieve a wider overall fractional division range.

Figure 3:
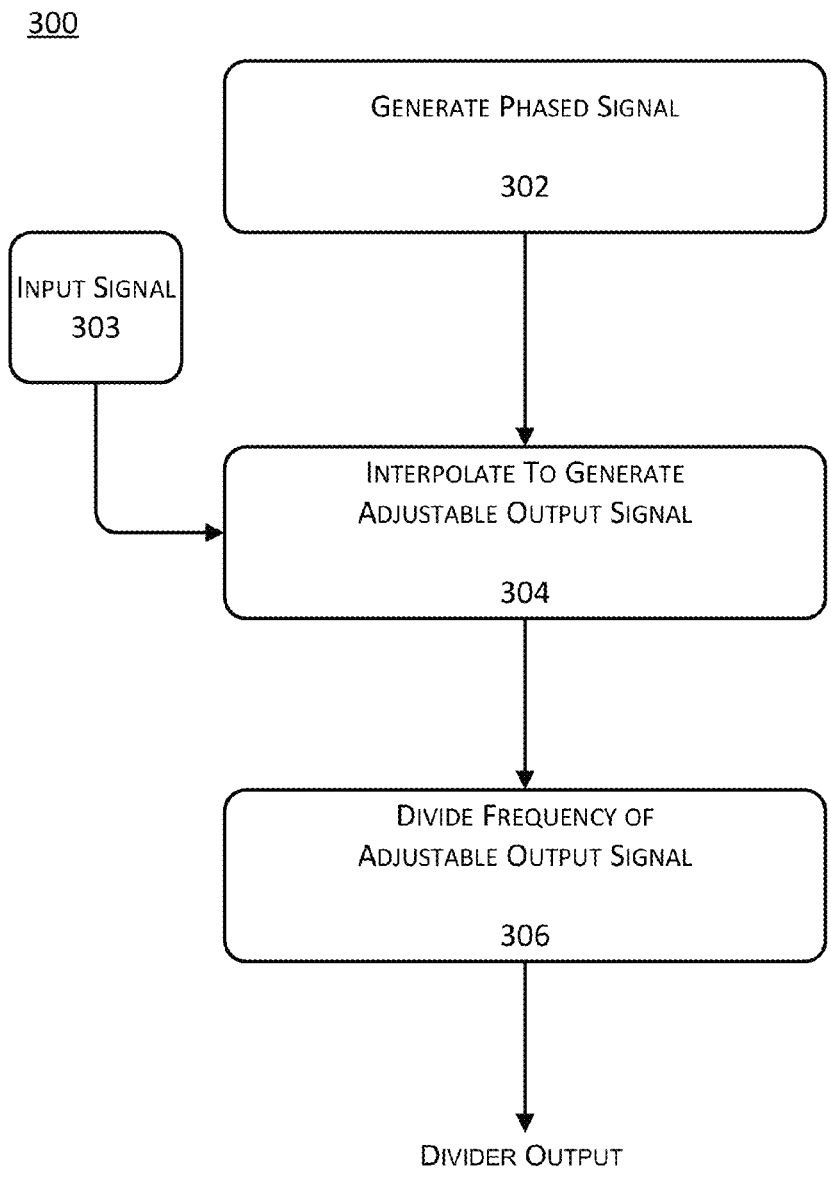
FIG. 3 shows a block diagram showing an example fractional frequency division process.

FIG. 3 shows a block diagram showing an example fractional frequency division process.

Block 302 may refer to CO 102 generating two or more phases.

Block 303 may refer to phase interpolator 104 receiving control 108 from either of a bus or from control engine 208. As set forth above, in the context of example system 200, control engine 208 may receive external settings 212 so as to dynamically change control 108. For instance, control engine 208 may be clocked by the divided output clock from divider 110; alternatively, control engine 208 may be clocked by other clocks available in the system 200. In at least one embodiment of system 200, control engine 208 may be implemented as a delta sigma modulator.

Block 304 may refer to phase interpolator 104 receiving the two or more phases from CO 102 and, further, interpolating the received phases to generate an adjustable output clock signal having a phase offset relative to the input two or more phases.

Block 306 may refer to integer-N divider 110 may receiving adjustable output clock signal 106 to execute integer division. Integer N divider 110 may divide adjustable output clock signal 106 by an integer factor but, since the phase of adjustable output clock signal 106 has been finely shifted in phase interpolator 105, fine fractional divider factor may be implemented.

Figure 4:
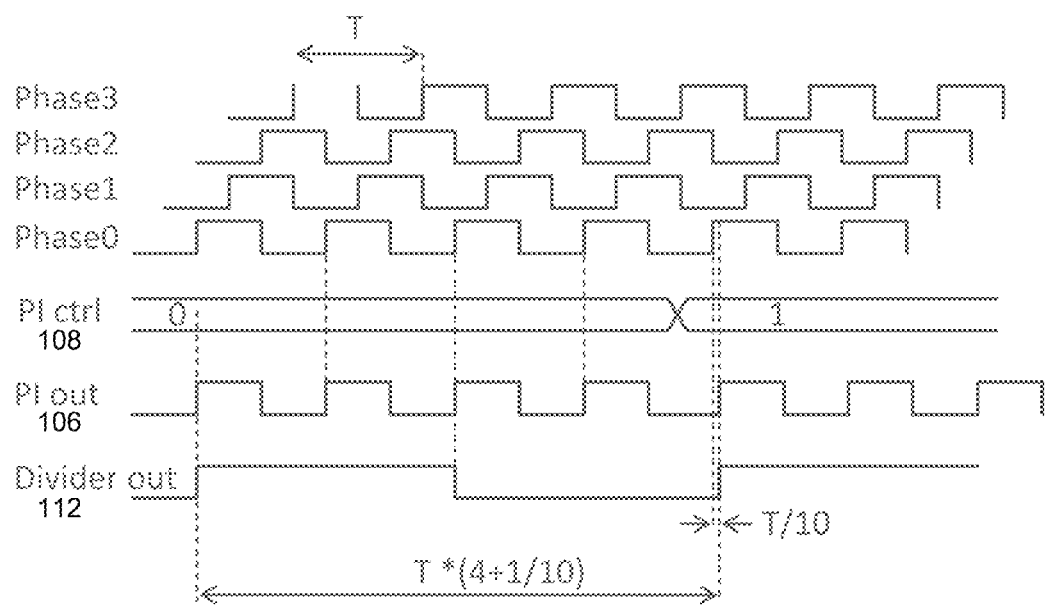
FIG. 4 shows waveforms of signals before, during, and after implementation of at least one example embodiment of fractional frequency division, as described herein.

FIG. 4 shows waveforms of signals before, during, and after implementation of at least one example embodiment of fractional frequency division, as described herein.

Integer divider 110 divides adjustable output clock signal 106 by the number of phases received by phase interpolator 104 from CO 102. In the examples of FIGS. 1 and 2, integer divider 110 divides by four, in accordance with the four inputs "Phase0," "Phase1," "Phase2," and "Phase3."

Before any subsequent rising edge of divided output clock 112 may be generated, the phase of adjustable output clock signal 106 may be advanced by one step, e.g., $1/10^{th}$ of the CO period, by changing the programming of the control 108 from digital 0 to digital 1. In this way a divider factor of $4+(1/10)$, i.e., fractional frequency division, may be achieved.

In other applications, e.g., clock and data recovery circuits, phase interpolator 104 having 5 bit resolutions may be implemented. In that context, quantization noise energy at output 112 of the fractional divider may be reduced to $1/(2^{\wedge}5*2^{\wedge}5) = 1/1024^{th}$ of the original approach.

Thus, control of phase interpolator 104 may be implemented so that quantization noise may be shaped to minimize its effect on system 100 or 200, for instance by use of a delta sigma modulator.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. A system, comprising:
   an oscillator to output phased signals;
   a phase interpolator to:
      receive the phased signals output by the oscillator,
      generate an adjustable output clock signal having a phase offset relative to at least one of the phased signals received from the oscillator;
      receive a control signal to digitally control the generation of the adjustable output clock signal, the control signal being a digital signal set at a digital 1 or a digital 0, the control signal is to control the phase interpolator so that the phase offset relative to the at least one phased signals received from the oscillator is a predetermined fractional amount of a period of the oscillator every clock cycle of an output of the divider; and
   a divider to divide the frequency of the output clock signal generated by the phase interpolator by an integer factor, the divider to receive a dynamically adjustable control signal to vary a division range of the divider.

2. The system according to claim 1, wherein the adjustable output signal has a same frequency as at least one of the phased signals received from the oscillator.

3. The system according to claim 1, wherein the adjustable output clock signal is adjustable in accordance with $(2^{\wedge}N_b)$ phase positions, wherein further $N_b$ corresponds to a number of control bits in the phase interpolator.

4. The system according to claim 1, wherein the phase offset is advancing.

5. The system according to claim 1, wherein the phase offset is lagging.

6. The system according to claim 1, wherein the control signal is dynamically changed according to external settings.

7. The system according to claim 6, wherein the control signal is output by a control engine.

8. The system according to claim 6, wherein the control signal is output by a delta sigma modulator.

9. The system according to claim 1, wherein a frequency of the control signal is the divided frequency output by the divider, or the frequency of the control signal is another frequency associated with the system.

10. A method, comprising:
generating a phased signal;
interpolating, based on a digital control signal set at a digital 1 or a digital 0, the phased signal to generate an adjustable output clock signal having a phase offset relative to the phased signal, the digital control signal is to control the interpolating so that the phase offset relative to the phased signal is a predetermined fractional amount of a period of the phase signal every clock cycle of the divided adjustable output clock signal; and
dividing the frequency of the adjustable output clock signal by an integer factor, the dividing controlled by an adjustable control signal to vary the integer value.

11. The method according to claim 10, wherein the adjustable output clock signal has a same frequency as the phased signal.

12. The method according to claim 10, wherein the adjustable output clock signal is adjustable in accordance with ($2^{N_b}$) phase positions, wherein further $N_b$ corresponds to a number of control bits in the phase interpolator.

13. The method according to claim 10, wherein the phase offset is advancing or lagging.

14. The system according to claim 10, wherein the control signal is dynamically changed according to external settings.

15. The method according to claim 10, wherein a frequency of the control signal is the divided frequency, or the frequency of the control signal is another frequency associated with the system.

16. The method according to claim 10, wherein the control signal is output by a control engine.

17. The method according to claim 10, wherein the control signal is output by a delta sigma modulator.

\* \* \* \* \*